(12) United States Patent
Pillai et al.

(10) Patent No.: US 12,130,329 B2
(45) Date of Patent: Oct. 29, 2024

(54) METHODS AND APPARATUS TO IMPLEMENT A BOUNDARY SCAN FOR SHARED ANALOG AND DIGITAL PINS

(71) Applicant: Texas Instruments Incorporated, Dallas, TX (US)

(72) Inventors: Prasanth Viswanathan Pillai, Bangalore (IN); Swathi Gangasani, Bangalore (IN); Vaskar Sarkar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/115,739

(22) Filed: Feb. 28, 2023

(65) Prior Publication Data

US 2024/0288496 A1    Aug. 29, 2024

(51) Int. Cl.
*G01R 31/3177* (2006.01)
*G01R 31/3167* (2006.01)
*G01R 31/3185* (2006.01)

(52) U.S. Cl.
CPC ..... *G01R 31/3177* (2013.01); *G01R 31/3167* (2013.01); *G01R 31/318508* (2013.01); *G01R 31/318533* (2013.01); *G01R 31/318536* (2013.01)

(58) Field of Classification Search
CPC ............ G01R 31/3177; G01R 31/3167; G01R 31/318508; G01R 31/318533; G01R 31/318536
USPC ................................ 714/727, 726, 729, 740
See application file for complete search history.

(56) References Cited

U.S. PATENT DOCUMENTS

| | | | | |
|---|---|---|---|---|
| 6,125,464 A | * | 9/2000 | Jin | G01R 31/318572 714/724 |
| 6,374,380 B1 | * | 4/2002 | Sim | G01R 31/318536 714/742 |
| 7,454,677 B2 | * | 11/2008 | Whetsel | G01R 31/318541 714/726 |
| 7,586,357 B2 | | 9/2009 | Rentala et al. | |
| 7,928,760 B2 | * | 4/2011 | Bernasconi | G01R 31/318572 326/38 |
| 8,713,388 B2 | * | 4/2014 | Chen | G01R 31/3008 714/724 |
| 9,267,989 B2 | * | 2/2016 | Chen | G01R 31/3177 |
| 2003/0208708 A1 | * | 11/2003 | Sunter | G01R 31/3167 714/727 |
| 2007/0236202 A1 | | 10/2007 | Cicalini | |
| 2009/0201049 A1 | * | 8/2009 | Bernasconi | G01R 31/318572 326/62 |
| 2010/0066428 A1 | * | 3/2010 | Tsai | G11C 27/02 327/309 |

(Continued)

OTHER PUBLICATIONS

Shrivastava et al., Multi-Voltage GPIO Design and its Physical Implementation, Oct. 2018, IEEE, pp. 1-4 (Year: 2018).*

(Continued)

*Primary Examiner* — John J Tabone, Jr.
(74) *Attorney, Agent, or Firm* — Frank D. Cimino; Carl G. Peterson (57) ABSTRACT

An example apparatus includes a buffer configured to, when enabled: obtain an input voltage; and provide the input voltage to a first boundary cell; and a second boundary cell configured to, when the apparatus is used in analog mode and a boundary scan occurs disable the buffer.

20 Claims, 5 Drawing Sheets

(56) References Cited

U.S. PATENT DOCUMENTS

| | | | |
|---|---|---|---|
| 2011/0202804 A1* | 8/2011 | Sunter | G01R 31/3177 714/E11.155 |
| 2012/0216089 A1* | 8/2012 | Chen | G01R 31/3177 700/121 |
| 2014/0208178 A1* | 7/2014 | Sunter | G01R 31/318577 714/731 |
| 2014/0223250 A1* | 8/2014 | Chen | G01R 31/3177 714/727 |
| 2023/0315142 A1* | 10/2023 | Zwerg | G06F 1/10 713/501 |

OTHER PUBLICATIONS

Corelis, "Boundary Scan Tutorial," retrieved Jan. 18, 2023 at https://www.corelis.com/education/tutorials/boundary-scan/.

* cited by examiner

METHODS AND APPARATUS TO IMPLEMENT A BOUNDARY SCAN FOR SHARED ANALOG AND DIGITAL PINS

TECHNICAL FIELD

This description relates generally to integrated circuitry, and more particularly to methods and apparatus to implement a boundary scan for shared analog and digital pins.

BACKGROUND

A boundary scan is a protocol implemented on a system on chip (SoC) to test interconnects between printed circuit boards, chips, and/or integrated circuits (IC) to verify that the interconnects are working as intended. To facilitate a boundary scan, the printed circuitry boards, chips, and/or ICs include a test cell or boundary cell that is able to override functionality of a pin to drive values into an input and/or obtain values out of an output to verify the outputs correspond to intended values. The boundary scan protocol may be governed by a standard (e.g., the IEEE 1149.1 standard).

SUMMARY

For a boundary scan for shared analog and digital pins, an example integrated circuit includes an buffer including an input terminal, an output terminal, and an enable terminal, the output terminal of the buffer coupled to an input terminal of a first boundary cell: a logic gate including an input terminal and an output terminal, the input terminal of the logic gate coupled to a select terminal of a general purpose input output (GPIO); and a second boundary cell including an input terminal and an output terminal, the input terminal of the second boundary cell coupled to the output terminal of the logic gate and the output terminal of the second boundary cell coupled to the enable terminal of the buffer.

BRIEF DESCRIPTION OF THE DRAWINGS

The same reference numbers or other reference designators are used in the drawings to designate the same or similar (functionally and/or structurally) features.

DETAILED DESCRIPTION

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/ or irregular.

A boundary scan is used to verify that the interconnections between chips and/or circuits on a board are working correctly. A boundary scan may be performed during the manufacturing process, during initialization, and/or periodically, aperiodically, or based on a trigger after initialization. Because boundary scans may be governed by a standard, circuit designers may be limited in the implementation of a chip based on the boundary scan standard. Of particular note, a standard may have restrictions that impede boundary scan testing of pins that support both digital and analog functionality. For example, some standards preclude a circuit design from using a preamble sequence to differentiate between analog and digital operation of a pin. Accordingly, the boundary scan standard may provide hurdles in the configuration of a shared pin capable of operating in analog or digital.

In some designs for digital pins, an output buffer and an input buffer are used in conjunction with boundary cells to facilitate boundary scans for shared (analog and digital) pins. A boundary cell is a circuit that can override the functionality of the IC to cause the IC to obtain and/or output voltages as part of the boundary scan protocol. An output buffer is a buffer that is used to drive a voltage to an input output pin based on a signal from a first and second boundary cell and the input buffer is a buffer that is used to obtain a voltage from the input/output pin and forward the voltage to the second boundary cell. In some such designs, the output buffer is only enabled when the boundary scan protocol corresponds to instructions to drive the output buffer to output a voltage and the input buffer is always enabled. However, for a shared pin, the pin may be configured to operate in analog mode. When the pin is operating in analog mode, an input signal could be a low voltage (e.g., 0 volts (V)) a high voltage (e.g., 3.3 V) or any voltage in between (e.g., for an analog signal). During a boundary scan, shared pins implementing digital functionality are tested in digital mode. In some devices, the analog pins may not be covered as part of the boundary scan. If a shared pin were to simply add the input buffer and output buffer from the designs to implement boundary scan tests for digital pins and the shared pin was operating in analog mode, an analog voltage may be input into the pin at some voltage between the high and low voltages, thereby causing a through-current path to be created in the input buffer. For example, if the input buffer is driven to 1.7 V, depending on the state of the pins, there can be a current path that leads to significant leakage current on the pin. If the design includes multiple pins, a large amount of undesirable leakage current may occur.

Examples disclosed herein provide circuitry that enables boundary scan of a shared pin when in digital mode. In some examples, shared pins are excluded from boundary scan when the pins are in analog mode to avoid leakage current. Examples disclosed herein provide an additional boundary cell and logic circuitry that disables the input buffer during analog mode to avoid leakage current and enables the input buffer for boundary scans when in digital mode. Examples disclosed herein address boundary scan requirements for shared pins (e.g., corresponding to analog general purpose input outputs (AGPIO)) and abide by boundary scan standards with minimal circuitry and low overhead. Additionally, examples disclosed herein allow a user more control over the pin by allowing the user to select analog or digital mode for the pin while allowing boundary scans in digital mode and disabling boundary scans in analog mode.

Figure 1:
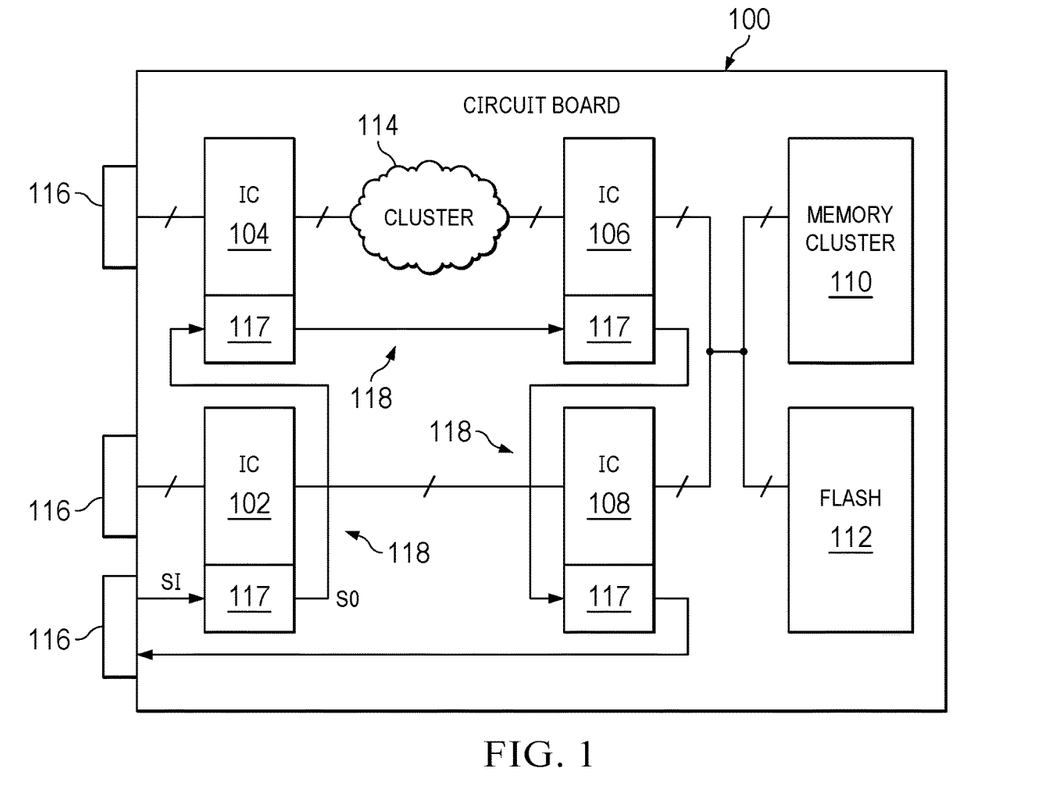
FIG. 1 is a schematic diagram of a circuit board described in conjunction with examples disclosed herein.

FIG. 1 is a schematic diagram of an example circuit board 100. The example circuit board 100 includes example ICs 102, 104, 106, 108, an example memory cluster 110, example flash 112, example cluster circuitry 114, example connectors 116, a test access port (TAP) controller 117, and an example serial interconnect 118. Although the example circuitry board 100 includes a configuration of four ICs and one cluster, the circuit board 100 may correspond to any configuration that utilizes interconnects between ICs and/or other circuitry.

The ICs 102, 104, 106, 108 of FIG. 1 include semiconductor components to perform one or more functions based on input data. Each IC 102, 104, 106, 108 includes a number of input terminals for input data and a number of output terminals to output data. For example, the IC 102 includes multiple inputs and/or output terminals that are coupled to the IC 108 and/or the connectors 116. However, the IC 102 may be connected with any other component on the circuitry board 100. In the example of FIG. 1 the interconnects between IC 102 and IC 108 are direct interconnects and the interconnects between IC 104 and 106 are via the cluster circuitry 114. The cluster circuitry 114 may include additional components that are not part of an IC but may affect the value output by the IC 104. The ICs 102, 104, 106, 108 may access the memory cluster 110 and/or flash 112 (e.g., directly or via another IC).

Additionally, the ICs 102, 104, 106, 108 are connected via the serial interconnect 118. Each of the ICs 102, 104, 106, 108 includes a TAP controller 117 to facilitate the boundary scan via the serial interconnect 118. For example, a connected device (e.g., a test system connected via the connector 116) can transmit one or more signals through the TAP controllers 117 via the serial interconnect 118 that causes boundary cells in each IC 102 to control the input and outputs of each IC 102, 104, 106, 108 to verify that the inputs/outputs correspond to intended outputs based on the driven inputs. For example, the boundary scan may cause the TAP controller 117 to control a first boundary cell of the IC 102 to output a first value to the IC 108 and cause the TAP controller 117 to control a boundary cell in the IC 108 to verify that the obtained value corresponds to the instructed first value, thereby verifying whether there is an issue with the interconnect (e.g., if the obtained voltage does or does not match (e.g., by more than a threshold) the intended voltage or expected voltage). If there is circuitry between ICs (e.g., the cluster 114 between IC 104, 106), the device operating the boundary scan (e.g., the connected device coupled to connector 116) would be aware of the circuitry and would predict the intended input based on the output of the first IC and the functionality of the cluster 114. As further described below in conjunction with FIG. 2, examples disclosed herein correspond to operation of a shared pin (e.g., input/output pin that can operate as an analog interface/terminal or a digital interface/terminal) that can be part of a boundary scan in both analog mode and digital mode that reduces leakage current. For example, the TAP controller 117 uses the boundary scan circuitry to override control of a shared interface that includes a shared pin to enable or disable an input buffer in the shared interface based on whether the shared pin is in analog mode or digital mode, as further described below in conjunction with FIG. 2.

Figure 2:
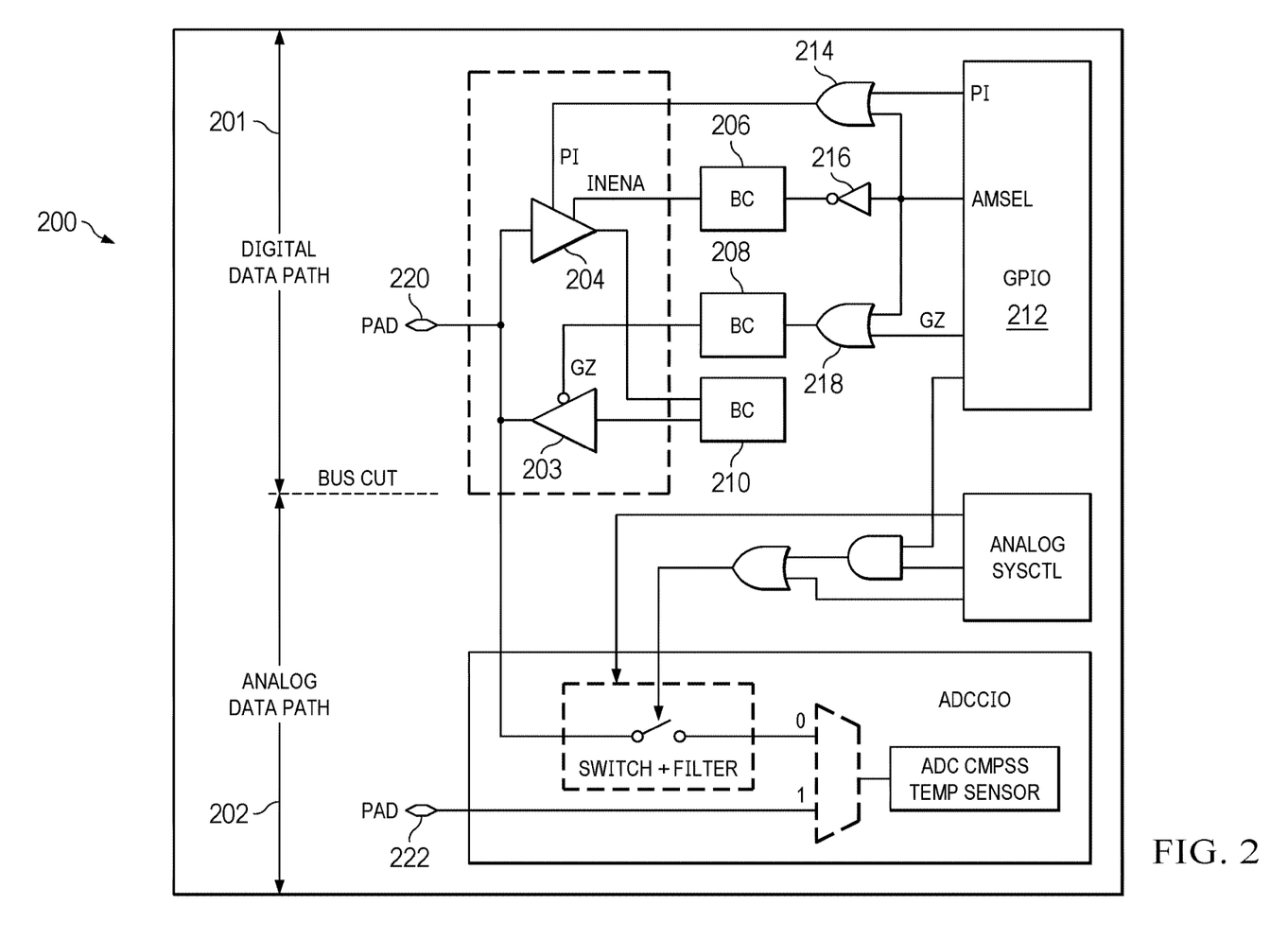
FIG. 2 is a schematic diagram of a shared interface implemented in one of the integrated circuits of the circuit board of FIG. 1.

FIG. 2 is a schematic diagram of an example shared interface 200 that is connected to a shared pin of the IC 102 of the circuit board 100 of FIG. 1. However, FIG. 2 may be described in conjunction with any IC (e.g., IC 104, 106, 108 of FIG. 1 and/or any other IC that has boundary scan functionality). The shared interface 200 includes an example digital data path 201 and an example analog data path 202. The digital data path 201 includes circuitry for handling the digital values during a boundary scan while avoiding leakage current for analog values and the analog data path 202 includes circuitry for handling analog values. Additionally, the digital data path 201 and/or the analog data path 202 may include additional circuitry for handling digital values when not operating in boundary scan mode (e.g., normal operation), which is not shown in FIG. 2. For example, the digital data path 201 may include a multiplexer (MUX) or other circuitry to control when the boundary scan circuitry is used and when the boundary scan circuitry is not to be used and the other circuitry is used during normal operation.

The shared interface 200 includes an example output buffer 203, an example input buffer 204, example boundary scan cells (BCs) 206, 208, 210, an example general purpose input output (GPIO) 212, example logic gates 214, 216, 218, an example pad 220 (e.g., a shared pad or AGPIO pad), and an example analog pad 222 (e.g., an analog signal only pad). The example BC 206 is also referred to herein as the BC, the example BC 208 is also referred to herein as the BC and the BC 210 is also referred to herein as the BC. The pad 220 is coupled to the shared (e.g., AGPIO) pin of the IC 102. Accordingly, signals may be obtained and/or transmitted via the pad 220. Additionally or alternatively, analog signals may be obtained (e.g., via the analog pad 222) and/or transmitted via the pad in the analog data path 202. Although the components are illustrated as particular components, other components and/or combinations of components may be used to perform the same functionality as the illustrated components. For example, the enable terminal of the input buffer 204 may be replaced with a switch or transistor to connect or disconnect the voltage on the pull line into the pull terminal (Pl) of the buffer 204 (e.g., disconnecting the pull terminal may have the same function as sending a signal to the enable terminal).

In the example of FIG. 2, the output buffer 203 includes an input terminal coupled to the BC 210, an output terminal coupled to the pad 220; the input of the input buffer 204; and the analog processing circuitry of the analog data path, and an inverted enable (e.g., power) terminal coupled to the output of the BC 208. In some examples, the inverted enable may be a regular enable coupled to inverting circuitry (e.g., a NOT gate). The input buffer 204 includes an output terminal coupled to the BC 210, an input terminal coupled to the pad 220; the output of the output buffer 203; and the analog processing circuitry of the analog data path, an enable (e.g., power) terminal coupled to the output of the BC 206, and a pull terminal coupled to the output of the logic gate 214. The BC 206 is coupled to the enable/power terminal of the input buffer 204 and the output of the logic gate 216.

Additionally, the BC 206 includes an input terminal and output terminal for obtaining and transmitting a signal via the serial interconnect 118 of FIG. 1, as further described below in conjunction with FIG. 4. The BC 208 is coupled to the inverted enable/power terminal of the output buffer 203 and the output of the logic gate 218. Additionally, the BC 208 includes an input terminal and output terminal for obtaining and transmitting a signal via the serial interconnect 118 of FIG. 1, as further described below in conjunction with FIG. 4. The BC 210 is coupled to the output of the input buffer 204 and the input of the output buffer 203.

Additionally, the BC 210 includes an input terminal and output terminal for obtaining and transmitting a signal via the serial interconnect 118 of FIG. 1, as further described below in conjunction with FIG. 4. The logic gate 214 (e.g., a logic OR gate) includes a first input terminal coupled to the pull terminal of the GPIO 212, a second input terminal coupled to the AMSEL (analog or digital select) terminal of the GPIO 212; the input of the logic gate 216; and the first input of the logic gate 218, and an output terminal coupled to the pull terminal of the input buffer 204. The logic gate 216 (e.g., a logic NOT gate) includes an input terminal coupled to the AMSEL (analog or digital mode select) terminal of the GPIO 212, the input of the logic gate 214, and the first input of the logic gate 218 and an output terminal coupled to the BC 206. The logic gate 218 (e.g., a logic OR gate) includes a first input coupled to the GZ terminal of the GPIO 212, a second input terminal coupled to AMSEL terminal of the GPIO 212; the second input of the logic gate 214; and the input of the logic gate 216; and an output terminal coupled to the BC 208. The GPIO 212 outputs (e.g., provides) the AMSEL signal as a high voltage or a low voltage based on whether the shared interface 200 is to operate in analog mode or digital mode (e.g., which may be selected by a user, manufacturer, and/or by a boundary scan controller or protocol).

During normal or functional operation, a user or another device may select to have the shared interface 200 operate in analog mode or digital mode. When the shared interface 200 is to operate in digital mode the GPIO 212, the GPIO 212 outputs (e.g., provides) a first value (e.g., '0' or 0 V) from the AMSEL terminal to signify the digital mode. Accordingly, the logic gates 214, 216, 218 all obtain a low voltage or '0' value. Accordingly, the pull terminal of the input buffer 204 is controlled by the pull terminal of the GPIO 212 (e.g., via the logic gate 214) because the logic OR of (A) '0' and (b) the value of pull will equal the value of pull. The pull terminal corresponds to the voltage output from the input buffer 204 when the input buffer 204 outputs (e.g., provides) a logic '1' value. Additionally, the enable terminal of the output buffer 203 is controlled by GZ (e.g., via the output of the logic gate 218) because the logic OR of (A) '0' and (B) the value of GZ will equal the value of GZ. Additionally, the voltage at the enable terminal of the input buffer 204 will be high, thereby enabling the input buffer 204 for use during the digital boundary scan because the output of the logic gate 216 is high when the input it low and the BC 206 will output the high voltage to the enable terminal of the input buffer 204. Control of the BC 206 is based on the signal on the serial interconnect 118 of FIG. 1 and/or the output of the logic gate 216 as further described below in conjunction with FIG. 4.

As described above, the GPIO 212 further outputs a pull voltage via the pull terminal to control the voltage output by the input buffer 204. Additionally, the GPIO 212 outputs a low or high signal (e.g., '0' or '1', 0 V or 3.3 V, etc.) via the example GZ terminal to enable or disable the output buffer 203. For example, if the GPIO 212 is a low signal, the logic gate 218 will output a low signal (e.g., 0V from GZ OR 0 V from AMSEL=0V), which, when inverted by the inverted enable terminal of the output buffer 203 will enable the output buffer 203 to drive an voltage out to the pad 220. If the GPIO 212 is a high signal, the logic gate 218 will output a high signal (e.g., 3.3 V from GZ OR 0 V from AMSEL), which, when inverted by the inverted enable terminal of the output buffer 203 will disable the output buffer 203. Accordingly, the GPIO 212 outputs a low voltage at the GZ terminal to drive a voltage to the pad 220 and outputs a high voltage to disable the output buffer 203 (e.g., so that the input buffer 204 can obtain a digital voltage from the pad 220. Thus, during a functional digital mode, the input buffer 204 can be controlled based on the AMSEL signal. During a functional analog mode, the GPIO 212 outputs a second value (e.g., '1' or 3.3 V) from the AMSEL terminal to signify analog mode. The second value is input into the logic circuitry 214, 216, 218 to control the buffers 203, 204.

When a boundary scan is to be performed, the GPIO 212 may lose control and/or output inconsistent values. Accordingly, during a boundary scan, the TAP controller 117 of FIG. 1 takes control of the shared interface 200 using the example BCs 206, 208, 210. The TAP controller 117 determines whether the shared interface 200 is operating in analog mode or in digital mode. When a boundary scan is to be performed and the pin is connected to an analog resource (e.g., corresponding to analog mode), the pin and corresponding shared interface 200 is not expected to be part of the digital boundary scan. As described above, in functional mode, the GPIO 212 outputs a second value (e.g., '1' or 3.3 V) from the AMSEL terminal to signify the analog mode. However, the GPIO 212 cannot control the output value during the boundary scan mode. Thus, the TAP controller 117 will output instructions via a boundary scan chain which will scan in a value such that BC 206 cell will get a value of zero (e.g., 0 V). In response to obtaining the value of zero, the BC 206 will output 0 V, thereby causing the voltage at the enable terminal of the input buffer 204 to be low (e.g., 0 V), which disables the input buffer 204 for use during the boundary scan. In this manner, if an analog voltage is obtained from the pad 220 or output by another component during the boundary scan, the analog voltage will not cause leakage current through the input buffer 204 because the input buffer 204 will be disabled. When a boundary scan is to be performed and the pin is connected to a digital resource (e.g., corresponding to digital mode), the pin and corresponding shared interface 200 is expected to be part of the digital boundary scan. Thus, the TAP controller 117 will output instructions via a boundary scan chain which will scan in a value such that BC 206 cell will get a value of '1' (e.g., 3.3 V). In response to obtaining the value of '1', the BC 206 will output a '1' (e.g., 3.3 V), thereby causing the voltage at the enable terminal of the input buffer 204 to be high (e.g., 3.3 V), which enabled the input buffer 204 for use during the boundary scan. Accordingly, the BC 206 facilitates the enable and disable of the input buffer during boundary scan (e.g., depending on whether the shared interface 200 is operating in digital mode or analog model) to allow the shared pin coupled to the shared interface 200 to operate in analog or digital mode and perform a boundary scan. The structure and functionality of the BC 206 is further described below in conjunction with FIG. 4.

Figure 3:
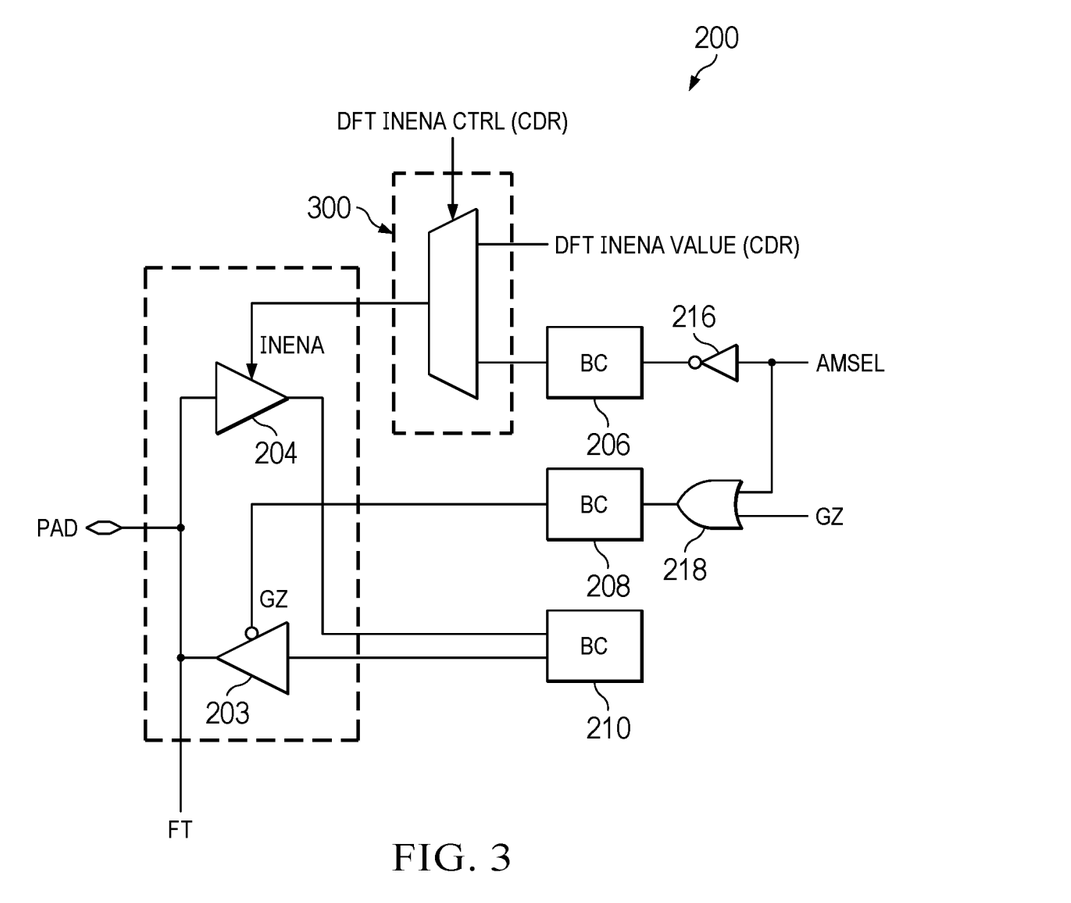
FIG. 3 is a schematic diagram of an alternative portion of one of the shared interface of FIG. 2.

FIG. 3 is a schematic diagram of an alternative portion of one of the shared interface 200 of FIG. 2. The example portion of the shared interface 200 of FIG. 3 includes the example output buffer 203, the example input buffer 204, the example BCs 206, 208, 210, and the example logic gates 216, 218. Additionally, the alternative portion of the shared interface 200 of FIG. 3 may include any of the components of FIGS. 2 and/or 1. Additionally, the example portion of the shared interface 200 of FIG. 3 includes an example multiplexer (MUX) 300.

The MUX 300 of FIG. 3 includes a select (e.g., control) terminal, a first and second input terminal, and an output terminal. The first input terminal of the MUX 300 is coupled to another device (e.g., a core data register (CDR)) to obtain a design for testing (DFT) input enable (INENA) value. The second input terminal of the MUX 300 is coupled to the BC 206. The output terminal of the MUX 300 is coupled to the enable terminal of the input buffer 204. The select terminal of the MUX 300 is coupled to another device (e.g., the core data register (CDR)) to obtain a DFT INENA control (CTRL) value.

The MUX 300 of FIG. 3 provides additional control of the input buffer 204 for a DFT mode. A DFT mode is used to test the signals within the IC 102 by toggling values throughout digital logic components of the IC 102. Because the BC 206 includes flip flops (e.g., digital logic) the DFT mode will test those components as well. Accordingly, while testing the flip flops of the BC 206, the output of the flip flop may toggle high and low, which will cause the input buffer 204 to toggle between enable and disable. If the toggling is fast enough, the toggling can degrade and/or damage the input buffer 204. Accordingly, a component facilitating the DFT can, during a DFT, output a first value (e.g., logic '0', 0 V, etc.) for the DFT INENA control value to the select terminal of the MUX 300 to cause the MUX to output the DFT INENA value to the enable terminal of the input buffer 204, thereby avoiding the toggling output of the BC 206 while it is under DFT. When a DFT is not being performed, the component facilitating the DFT can output a second value (e.g., logic '1', 3.3 V, etc.) for the DFT INENA control value to the select terminal of the MUX 300 to cause the MUX 300 to output the value output by the BC 206 to the enable terminal of the input buffer.

Figure 4:
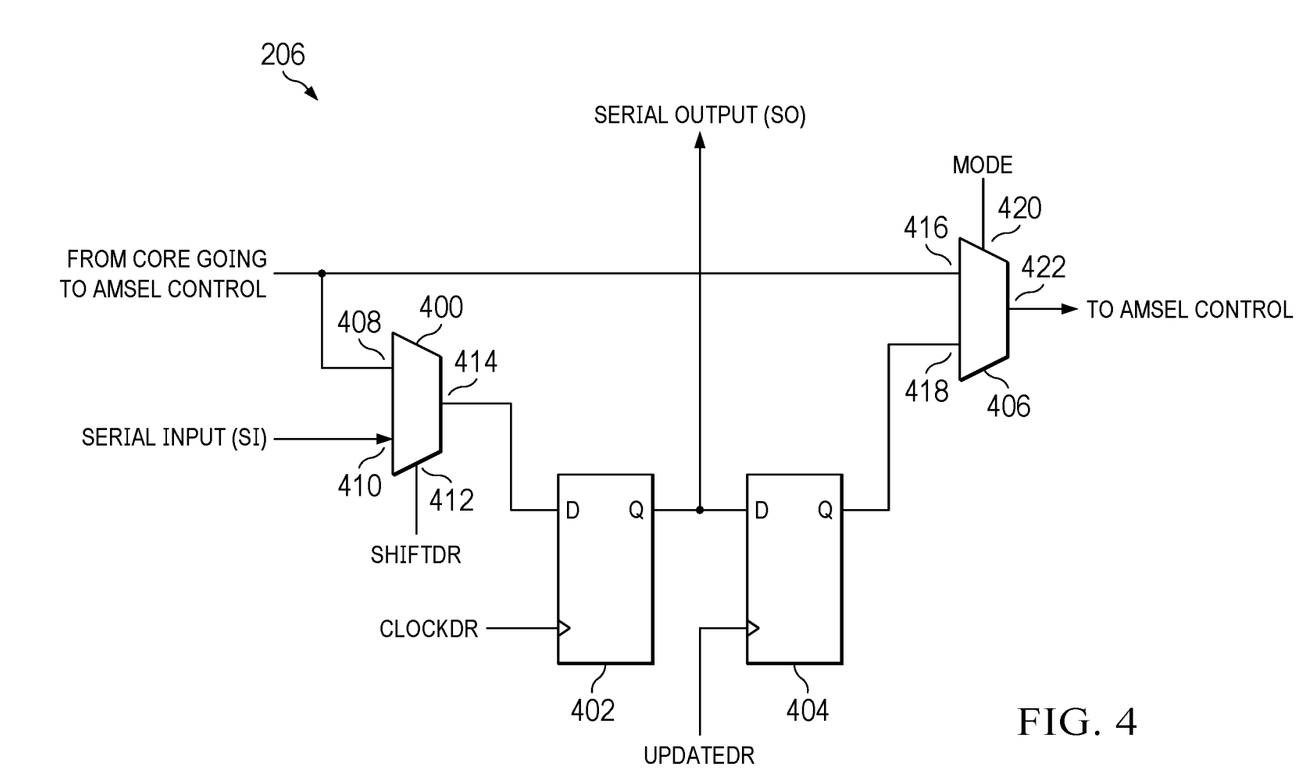
FIG. 4 is a schematic diagram of the boundary cell of FIG. 2.

FIG. 4 is a schematic diagram of the BC 206 of FIG. 2. In some examples, FIG. 4 may be a schematic drawing of any of the BCs 206, 208, 210 of FIG. 2. The BC 206 includes an example MUXs 400, 406 and example flip flops 402, 404. The example BC 206 is connected to the example TAP controller 117 (e.g., through the serial input connection (directly or indirectly), the clockdr connection, and theupdatedr connection). The BC 206 is also connected to the example GPIO 212 (e.g., via the logic gate 216) and the enable terminal of the input buffer 204, as further described above in conjunction with FIG. 2.

The MUX 400 of FIG. 4 includes a first input terminal 408, a second input terminal 410, a select terminal 412, and an output terminal 414. The first input terminal 408 of the MUX 400 is coupled to the GPIO 212 via the output of the logic gate 216. The second input terminal 410 of the MUX 400 is coupled to a serial input line that is coupled to (e.g., directly or via one or more other BCs) the example TAP controller 117. The select terminal 412 of the MUX 400 is coupled to the TAP controller 117. The output terminal 414 of the MUX 400 is coupled to a first input terminal of the flip flop 402. The flip flop 402 includes a first input terminal (D), a second input terminal (corresponding to clockdr) and an output terminal (Q). The second input terminal of the flip flop 402 is coupled to the TAP controller 117. The output terminal of the flip flop 402 is coupled to a first input of the second flip flop 404 and a subsequent BC, the TAP controller 117, or another IC. The second flip flop 404 includes a first input terminal (D), a second input terminal (corresponding to updatedr), and an output terminal (Q). The second input terminal of the flip flop 404 is coupled to the TAP controller 117. The output of the flip flop 404 is coupled to a second input terminal of the second MUX 406. The second MUX 406 includes a first input terminal 416, a second input terminal 418, a select terminal 420, and an output terminal 422. The first input terminal 416 is coupled to the GPIO 212 via the example logic gate 216 and the first input terminal of the MUX 400. The second input terminal 418 is coupled to the output of the flip flop 404. The select terminal 420 is coupled to the example TAP controller 117. The output terminal 422 of the MUX 406 is coupled to the enable terminal of the example input buffer 204 of FIG. 2.

The example BC 206 supports BSCAN instructions including BYPASS, IDCODE, SAMPLE/PRELOAD, EXTEST, and HIGHZ. SAMPLE/PRELOAD is similar to the functional operation of the interface 200 of FIG. 2. The AMSEL input value driven from the design will be captured by the BC 206. EXTEST is where the preloaded values (e.g., from the TAP controller 117) are used to drive the BC 206. For the EXTEST operation, BC 206 corresponds to the AGPIO with bscan support can be preloaded to '0' for digital operation and the pin will behave according to the signal output by the GPIO 212 of FIG. 2. In HIGHZ all pins will be tristated by suitably controlling BC 206.

As described above, during functional operation, the GPIO 212 of FIG. 2 generates the AMSEL output which is used to control (e.g., enable or disable) the input buffer 204 of FIG. 2. Accordingly, the TAP controller 117 of FIG. 1 outputs a first value (e.g., '0' or 0 V) to the select terminal of the MUX 406 to cause the output of the GPIO 212 to control the input buffer 204. However, when a boundary scan occurs, the TAP controller 117 outputs a second value (e.g., '1' or 3.3V) to the select terminal of the MUX 406 to disable and/or override the GPIO control. Instead, control of the input buffer 204 is based on the serial input (e.g., which passes instructions output by the TAP controller 117). Because the TAP controller 117 knows whether the shared interface 200 is configured for analog mode or digital mode, the instructions via the serial input will include a low value (e.g., if the shared interface 200 is in analog mode) or a high value (e.g., if the shared pin is in digital mode). The value is stored and output to the MUX 406 via the flip flops 402, 404. In this manner, the output of the MUX 406 corresponds to the instructions of the TAP controller 117 to disable the input buffer 204 during a boundary scan test when the shared interface 200 is in analog mode (e.g., because the output of the BC 206 is low) or to enable the input buffer 204 during a boundary scan test when the shared interface 200 is in digital mode (e.g., because the output of the BC 206 is high). The TAP controller 117 outputs values to the second input of the flip flops 402 404 to ensure that the instruction (e.g., the low value or high value) for the shared interface 200 is output by the BC 206 of the shared interface 206 and other instructions for other interfaces are output by the respective BCs of the other interfaces (e.g., via the serial output).

Figure 5:
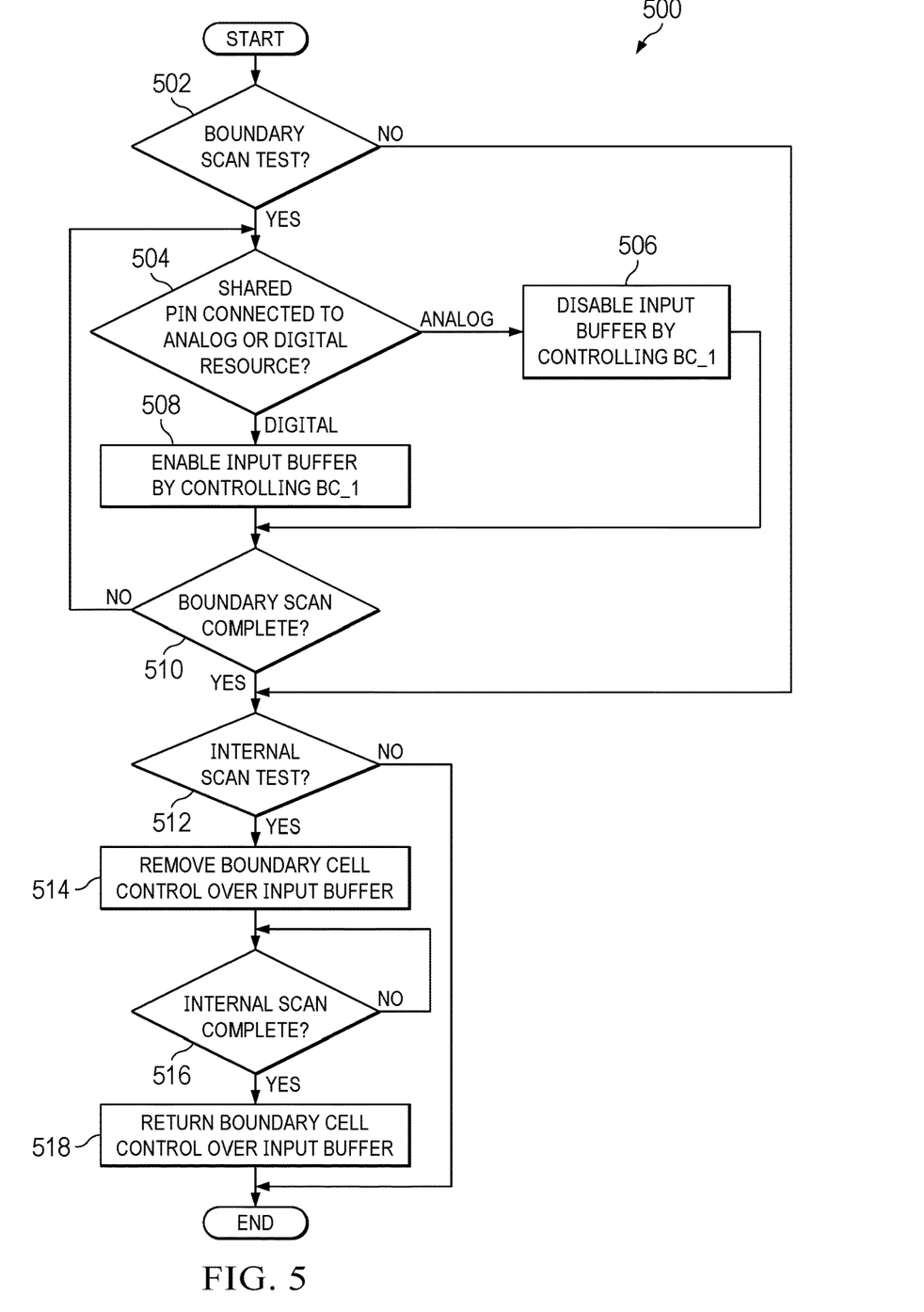
FIG. 5 is a flowchart representative of instructions and/or operations to implement the components of the circuit board and/or integrated circuit(s) of FIGS. 1-4.

FIG. 5 is an example flowchart 500 representative of instructions and/or functionality of the example share interface 200 of FIG. 2 and/or a method corresponding to examples disclosed herein. The example flowchart 500 begins at block 502 when the example TAP controller 117 determines if a boundary scan test should occur. For example, the TAP controller 117 may initiate a boundary scan test, periodically, aperiodically and/or based on a trigger/instruction.

If the TAP controller 117 determines that the boundary scan test is not occurring (block 502: NO), control continues to block 512. If the TAP controller 117 determines that the boundary scan test is occurring (block 502: YES), TAP controller 117 determines if the shared pin is connected to an analog or digital resource (e.g., if the shared pin is set to analog mode or digital mode) (block 504). If the TAP controller 117 determines that the shared pin is connected to an analog resource (block: 504: ANALOG), the TAP controller 117 controls the example BC 206 disables the input buffer 204 by sending a low voltage and/or '0' to the enable terminal of the input buffer 204 (block 506). For example, the BC 206 may obtain an instructions from the example TAP controller 117 of FIG. 1, via the serial input of FIG. 4. If the example BC 206 determines that the shared pin is set to digital mode (block: 504: DIGITAL MODE), the TAP controller 117 controls the example BC 206 enables the input buffer 204 by sending a high voltage and/or '1' to the enable terminal of the input buffer 204 (block 506). At block 510, the TAP controller 117 determines if the boundary scan is complete.

If the TAP controller 117 determines that the boundary scan is not complete (block 510: NO), control returns to block 504 and the process is continued until the boundary scan is complete. If the TAP controller 117 determines that the boundary scan is complete (block 510: YES), the example MUX 300 of FIG. 3 determines if an internal test scan is occurring (block 512). For example, a controller or a core data register may transmit a signal (e.g., a high voltage or a low voltage) to the select terminal of the MUX 300 when an internal scan is occurring. If the example MUX 300 determines that an internal scan is not occurring (block 512: NO), control ends. If the example MUX 300 determines that an internal scan is occurring (block 512: YES), the example MUX 300 removes boundary cell control over the input buffer (block 514). For example, the MUX 300 may output (e.g., via the output terminal of the MUX 300) a signal from a controller (e.g., from the first input terminal of the MUX 300), as opposed to the signal from the BC 206 (e.g., from the second input terminal of the MUX 300). As described above, the output terminal of the MUX 300 is coupled to the enable terminal of the input buffer 204. Thus, by not outputting the signal from the BC 206, the MUX 300 removes BC control over the input buffer 204.

At block 516, the example MUX 300 determines if the internal scan is complete (e.g., based on the signal at the select terminal of the MUX 300 from the controller). If the example MUX 300 determines that the internal scan is not complete (block 516: NO), control returns to block 516 until the internal scan is complete. If the example MUX 300 determines that the internal scan is complete (block 516: YES), the example MUX 300 returns BC control over the input buffer (block 518) by outputting (e.g., via the output terminal of the MUX 300) the signal from the BC 206. As described above, the output terminal of the MUX 300 is coupled to the enable terminal for the input buffer 204. Thus, by outputting the signal from the BC 206, the MUX 300 returns BC control over the input buffer 204.

In this description, the term "and/or" (when used in a form such as A, B and/or C) refers to any combination or subset of A, B, C, such as: (a) A alone: (b) B alone: (c) C alone; (d) A with B: (e) A with C: (f) B with C; and (g) A with B and with C. Also, as used herein, the phrase "at least one of A or B" (or "at least one of A and B") refers to implementations including any of: (a) at least one A: (b) at least one B; and (c) at least one A and at least one B.

Example methods, apparatus and articles of manufacture described herein improve shared pins in ICs by facilitating the use of the share pin as analog or digital in regular mode, DFT mode, and/or boundary scan mode while reducing and/or eliminating leakage current during the boundary scan and/or avoiding damage to an input buffer during the DFT mode.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

Numerical identifiers such as "first", "second", "third", etc. are used merely to distinguish between elements of substantially the same type in terms of structure and/or function. These identifiers as used in the detailed description do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate: (ii) incorporated in a single semiconductor package: (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. An integrated circuit comprising:
   a first boundary cell including an input terminal;
   an input buffer including an input terminal, an output terminal, and an enable terminal, the output terminal of the input buffer coupled to the input terminal of the first boundary cell;
   a general purpose input output (GPIO) circuit that includes a select terminal;
   a logic gate including an input terminal and an output terminal, the input terminal of the logic gate coupled to the select terminal of the GPIO circuit; and
   a second boundary cell including an input terminal and an output terminal, the input terminal of the second boundary cell coupled to the output terminal of the logic gate and the output terminal of the second boundary cell coupled to the enable terminal of the input buffer.

2. The integrated circuit of claim 1, wherein the logic gate is a NOT gate.

3. The integrated circuit of claim 1, further including a shared pad coupled to the input terminal of the input buffer, the shared pad is coupled to a shared pin, the shared pin corresponding to at least one of an analog signal or a digital signal.

4. The integrated circuit of claim 1, wherein the input terminal of the input buffer is coupled to an analog data path.

5. The integrated circuit of claim 1, further including a multiplexer, the output terminal of the second boundary cell coupled to the enable terminal of the input buffer via the multiplexer.

6. The integrated circuit of claim 5, wherein the multiplexer includes a first input terminal, a second input terminal, and an output terminal, the first input terminal of the multiplexer coupled to a core data register, the second input terminal of the multiplexer coupled to the output terminal of the second boundary cell, and the output terminal of the multiplexer coupled to the enable terminal of the input buffer.

7. The integrated circuit of claim 1, wherein the logic gate is a first logic gate, the integrated circuit further including:
   an output buffer including an inverted enable terminal;
   a second logic gate including a first input terminal, a second input terminal, and an output terminal, the first input terminal of the second logic gate coupled to a second terminal of the GPIO circuit, the second input terminal of the second logic gate coupled to the select terminal of the GPIO circuit, the output terminal of the second logic gate coupled to a pull terminal of the input buffer; and
   a third logic gate including a first input terminal, a second input terminal, and an output terminal, the first input terminal of the third logic gate coupled to the select terminal of the GPIO circuit, the second input terminal of the third logic gate coupled to a third terminal of the GPIO circuit, and the output terminal of the third logic gate coupled to an input terminal of a third boundary cell, the third boundary cell including an output terminal coupled to the inverted enable terminal of the output buffer.

8. The integrated circuit of claim 7, wherein the second logic gate and the third logic gate are a logic OR gates.

9. The integrated circuit of claim 7, wherein the output buffer includes an input terminal and an output terminal, the input terminal of the output buffer coupled to the first boundary cell and the output terminal of the output buffer coupled to the input terminal of the input buffer.

10. The integrated circuit of claim 1, wherein the second boundary cell further includes:
    a first multiplexer including a first input terminal, a second input terminal, a select terminal, and an output terminal, the first input terminal of the first multiplexer corresponding to the input terminal of the second boundary cell, the second input terminal of the first multiplexer coupled to least one of a third boundary cell or a controller, and the select terminal of the first multiplexer coupled to the controller;
    a first flip flop including a first input terminal, a second input terminal, and an output terminal, the first input terminal of the first flip flop coupled to the output terminal of the first multiplexer, the second input terminal of the first flip flop coupled to the controller, the output terminal of the first flip flop coupled to a fourth boundary cell;
    a second flip flop including a first input terminal, a second input terminal, and an output terminal, the first input terminal of the second flip flop coupled to the output terminal of the first flip flop and the second input terminal of the second flip flop coupled to the controller; and
    a second multiplexer including a first input terminal, a second input terminal, a select terminal, and an output terminal, the first input terminal of the second multiplexer coupled to the second input terminal of the first multiplexer, the second input terminal of the second multiplexer coupled to the output terminal of the second flip flop, the select terminal of the second multiplexer coupled to the controller, and the output terminal of the second multiplexer corresponding to the output terminal of the second boundary cell.

11. An apparatus comprising:
    a first boundary cell;
    a buffer configured to, when enabled:
      obtain an input voltage; and
      provide the input voltage to the first boundary cell; and
    a second boundary cell configured to, when the apparatus is used in analog mode and a boundary scan occurs, disable the buffer.

12. The apparatus of claim 11, wherein the second boundary cell is configured to, when the apparatus is used in digital mode and the boundary scan occurs, enable the buffer.

13. The apparatus of claim 11, wherein the buffer is configured to obtain the input voltage from a shared pin.

14. The apparatus of claim 11, further including a multiplexer configured to, when an internal scan occurs, remove control of the buffer from the second boundary cell.

15. The apparatus of claim 14, wherein the control corresponds to when to enable or disable the buffer.

16. The apparatus of claim 14, wherein the multiplexer is configured to provide a signal to at least one of enable or disable the buffer during the internal scan.

17. The apparatus of claim 11, wherein the input voltage is a digital voltage when the buffer is enabled and the input voltage is an analog voltage when the buffer is disabled.

18. The apparatus of claim 11, wherein the buffer is an input buffer.

19. The apparatus of claim 11, further including the first boundary cell to determine if the input voltage matches an expected voltage.

20. The apparatus of claim 11, further including a controller configured to:
   determine that the second boundary cell is used in analog mode; and
   send an instruction to the second boundary cell to cause the second boundary cell to output a voltage to the buffer to disable the buffer.

* * * * *